(12) United States Patent
Worrall

(10) Patent No.: US 7,705,553 B2
(45) Date of Patent: Apr. 27, 2010

(54) SERIAL BACKPLANE FOR MEDIUM VOLTAGE MOTOR DRIVE SYSTEM

(75) Inventor: Stephen Worrall, Cambridge (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 274 days.

(21) Appl. No.: 11/852,583

(22) Filed: Sep. 10, 2007

(65) Prior Publication Data

US 2009/0066282 A1    Mar. 12, 2009

(51) Int. Cl.
*G05B 11/32* (2006.01)
(52) U.S. Cl. .................. 318/625; 318/46; 318/51
(58) Field of Classification Search .......... 318/625, 318/46, 51, 798, 800, 802
See application file for complete search history.

(56) References Cited

U.S. PATENT DOCUMENTS

| 5,710,755 | A  | * | 1/1998 | Chen  | 370/294 |
| 5,742,143 | A  | * | 4/1998 | Katagiri | 318/625 |
| 6,430,634 | B1 | * | 8/2002 | Mito  | 710/100 |
| 6,686,712 | B2 | * | 2/2004 | Numaguchi et al. | 318/34 |

* cited by examiner

*Primary Examiner*—Rina I Duda
(74) *Attorney, Agent, or Firm*—Boyle Fredrickson LLP; Alexander R. Kuszewski

(57) ABSTRACT

A hybrid backplane uses multiple, parallel serial communication channels to provide flexibility and robustness in a motor drive control requiring high-speed data communication for the real-time control of motor waveforms.

18 Claims, 3 Drawing Sheets

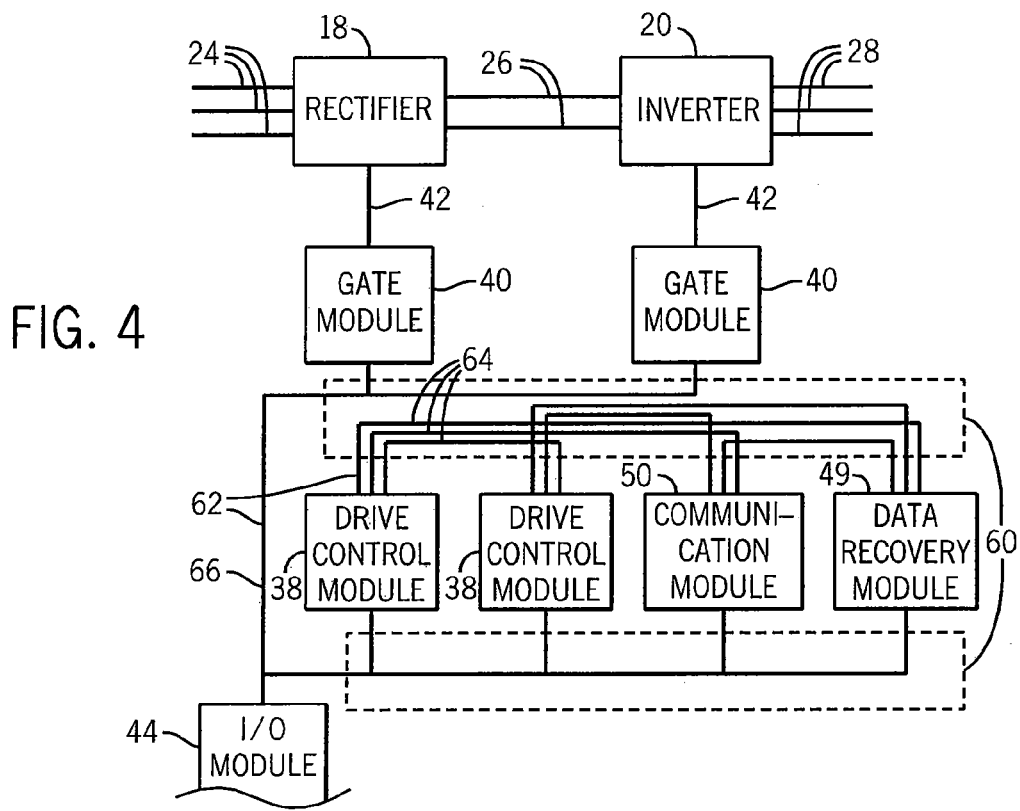
FIG. 4
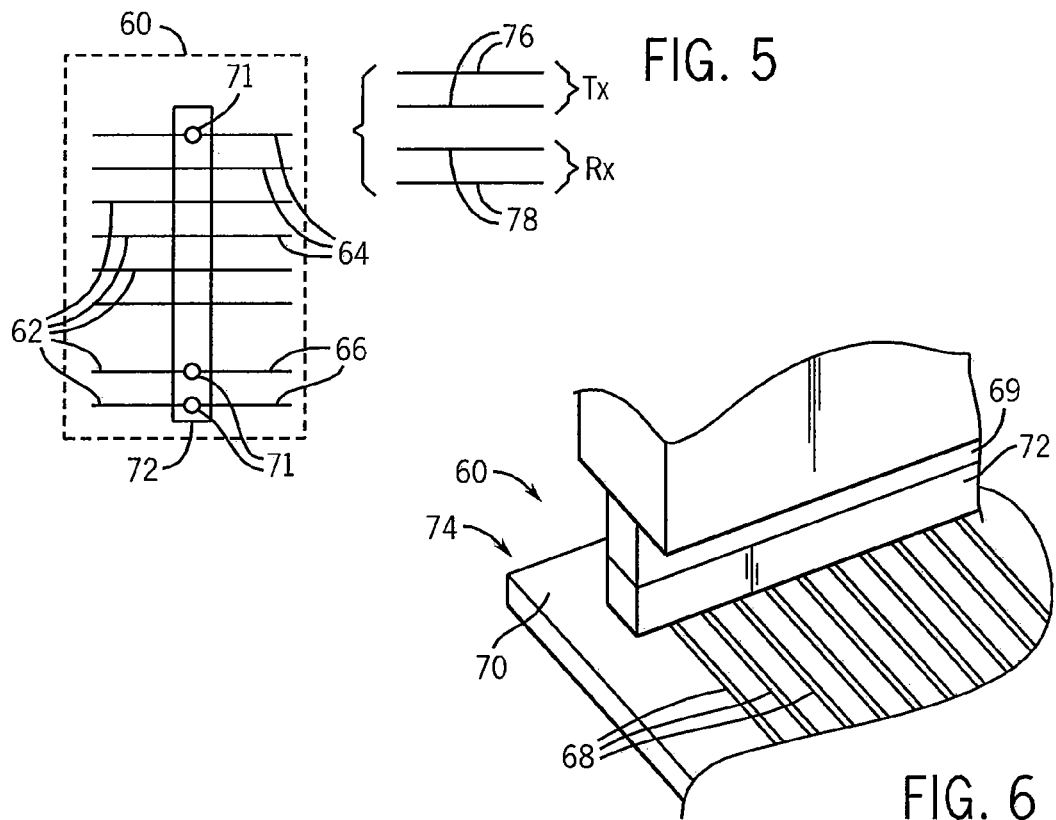
FIG. 5
FIG. 6

SERIAL BACKPLANE FOR MEDIUM VOLTAGE MOTOR DRIVE SYSTEM

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present invention relates to motor drives providing synthesized power waveforms to electric motors to control the operation of the motors, and in particular to an improved, modular interconnection system for such motor drives.

Industrial controllers use specialized computers and other electronic circuitry to control industrial processes and machines. The elements of an industrial controller must be easily reconfigured so that the industrial controller may be easily adapted to a variety of applications. For this reason, the elements of an industrial controller are normally modular, allowing different modules to be selected and assembled within a rack that provides for an interconnection between the modules. This approach allows a wide variety of different hardware configurations to be created rapidly.

Motor drives differ from a standard industrial controller in that extremely high communication rates are required among the different drive controls, for example, to precisely synchronize inverter/rectifier control in real time. Gating signals to rectifiers or inverters requires low latency. For this reason, the modules of a motor drive are normally interconnected with dedicated parallel communication channels between the various drive modules. Parallel communication channels communicate the bits of multi-bit data simultaneously with each bit assigned to a different conductor. Single bits of data, for example gating signals, may be assigned to a unique conductor so that multiple single bits are also transmitted in parallel. In this way, extremely high speeds of data transfer or low latency may be reached. These parallel communication channels may be implemented on a backplane, typically a printed circuit having multiple parallel conductors joining multiple connectors that may attach to the modules. As with an industrial controller, the modules may be assembled together within a rack abutting the backplane.

In an alternative to the backplane configuration, dedicated parallel communication channels may be implemented by the use of pairs of electrical connectors joined by ribbon cables or the like providing for the parallel conductors. The use of separate parallel channels can increase data speeds and reduce latency.

A drawback to such parallel bus structures is that they are relatively inflexible. In the backplane system, when additional single bit data must be transmitted, new conductors must be added to the backplane. This may require a fundamental redesign of the circuit boards of the system or may be impractical for reasons of costs or equipment size limitations. In the harness system, even though new wires may be added to the harness, the connector sizes must change requiring a change of the module circuit boards. Making and changing the connections between modules in the harness system is difficult, requiring the physical routing of wires between particular boards.

BRIEF SUMMARY OF THE INVENTION

The present invention combines the benefits of the physical backplane, allowing simple interconnection of modules, with the features of a high-speed serial network minimizing the number of conductors needed to transmit information. This is done by assembling a backplane not out of multiple parallel conductors but rather out of multiple parallel serial communication channels.

In the resulting "serial backplane" modules may be: easily assembled (through a conventional rack and connector system), flexibly reconfigured (via the addressing system of the serial protocol), resistant to single channel failures (by the use of multiple independent serial channels), and/or upgraded to control more gate signals without cost or space penalties (because of the natural conductor savings in serial data transmission).

Specifically then, the present invention provides a motor drive system controlling power semiconductor devices to provide controlled power to an electric motor. The motor drive system includes a rack having a housing with a backplane, the housing providing slots holding modules removably held within the rack so that releasable electrical connectors on a rear face of the modules abut mating electrical connector on the backplane. The motor drive system also uses a set of modules including at least one drive control module receiving command signals to provide gating signals for the control of the power semiconductor devices and at least two gate modules receiving gating signals and providing semiconductor drive signals to the power semiconductor devices. Significantly, the backplane provides a set of separate, serial communication channels communicating between the modules, each serial communication channel independently transferring multi-bit data words as sequential single bits.

It is thus a feature of one embodiment of the invention to effectively combine a backplane structure with a serial communication protocol to satisfy the unique requirements of a motor drive system.

The power semiconductors may be components of rectifiers or inverters.

It is thus another feature of one embodiment of the invention to provide a system that accommodates the flexible routing of gating signals used for semiconductor control of input and output power.

The separate serial communication channels may include at least one serial communication channel communicating with multiple modules to direct data to specific modules according to at least one address contained in the transmitted data.

It is thus a feature of one embodiment of the invention to provide a system that may flexibly route data among modules according to software configurations without rewiring.

The separate communication channels may also include at least one serial communication channel dedicated to one pair of modules.

It is thus another feature of one embodiment of the invention to provide a serial communication system that is resistant to single channel losses.

The serial communication channel may be full-duplex and provide a transfer rate in excess of two gigabits per second.

It is thus a feature of one embodiment of the invention to exploit high-speed data communication protocols to permit serial communication channels to stand in place of a high-speed parallel bus structure.

The set of modules may further include at least one communication module receiving command signals from a programmable logic controller and at least two drive control modules. The serial communication channels may provide a full mesh interconnection among the communication module and the drive control modules.

It is thus a feature of one embodiment of the invention to provide an interconnect system that may offer the robustness of full mesh interconnect that is resistant to communication failures and that is not easily available in a parallel backplane structure.

The set of modules further may include a data drive recorder recording data describing operation of the motor drive system.

It is thus a feature of one embodiment of the invention to provide ample data capacity for full recording of the operation of the motor drive system in real time.

Separate dedicated communication channels may communicate among the control modules and a shared communication channel may communicate among the control modules and the gate modules.

It is thus a feature of one embodiment of the invention to provide a backplane structure that flexibly accommodates different types of anticipated communication—those with high data rate and those that require lower data rates but reduced latency.

The modules further include input/output modules accepting feedback signals from outside the rack.

It is thus a feature of one embodiment of the invention to provide a system that may accommodate all communications normally required in a motor control system.

The serial communication channels use low voltage differential signaling.

It is thus a feature of one embodiment of the invention to provide an electrical technique that allows a high-speed serial communication protocol to be implemented in a backplane structure.

The control modules may include a computer executing stored software allowing the control modules to receive commands to change the gate modules to which they are connected by changing the addressing on a serial communication network.

It is thus another feature of one embodiment of the invention to allow software "re-wiring" of the motor control system.

Similarly the software may allow the control modules to assume the function of a failed control module.

It is thus a feature of one embodiment of the invention to provide a motor control system that may be robust against individual component failures.

These particular features and advantages may apply to only some embodiments falling within the claims and thus do not define the scope of the invention.

BRIEF DESCRIPTION OF THE DRAWINGS

FIG. 4 is a figure similar to that of FIG. 3 showing a modular interconnect system of the present invention using a serial backplane;

FIG. 5 is a simplified representation of the serial backplane structure of the present invention showing the assembly of the backplane out of multiple serial communication channels;

FIG. 6 is a perspective view of a portion of the backplane of FIGS. 4 and 5 showing the connector system used to connect the modules to the backplane;

DETAILED DESCRIPTION OF THE INVENTION

Figures 1, 2, 3:
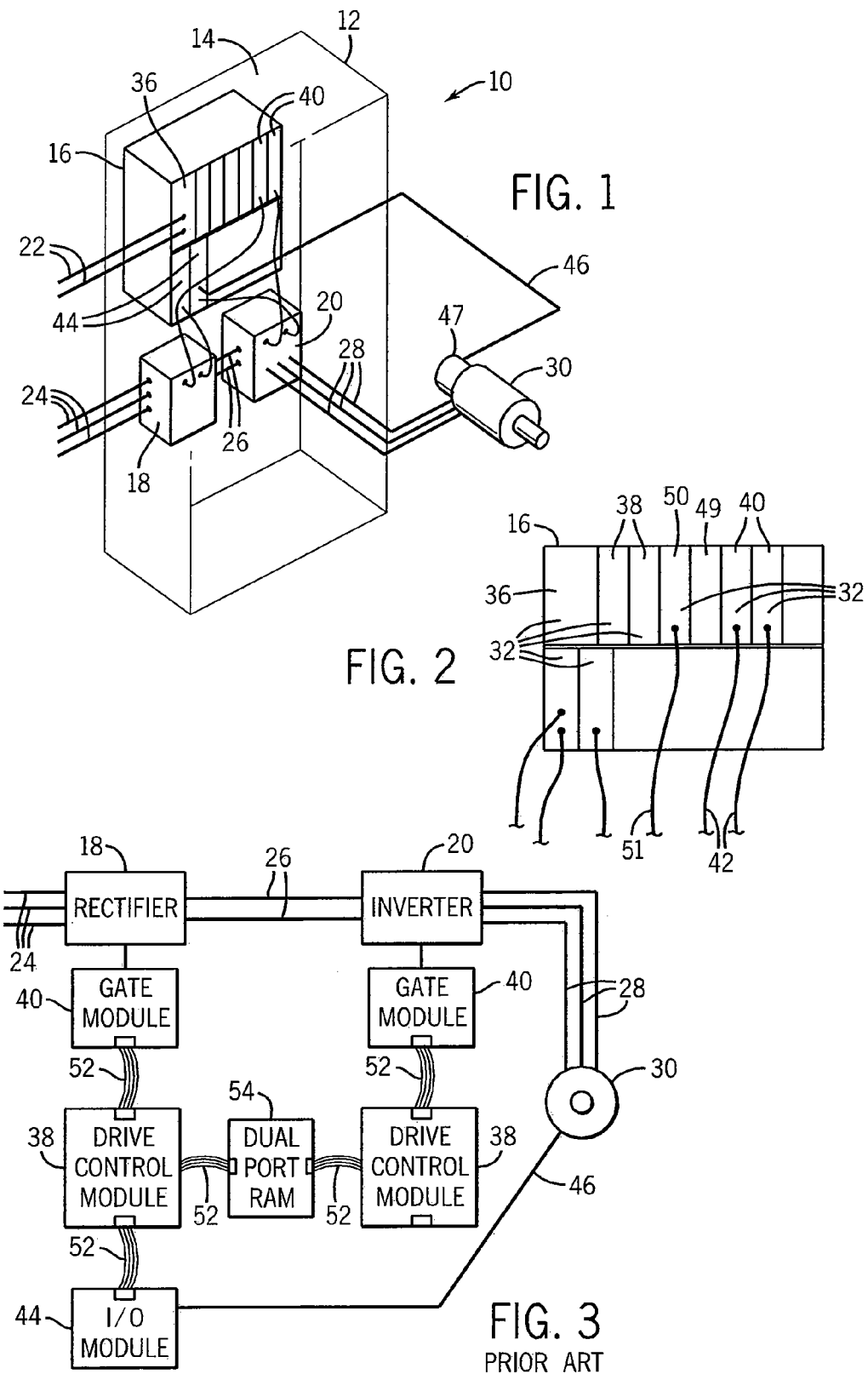
FIG. 1 is a simplified perspective view of a motor control system communicating with a rectifier and an inverter to control a motor.
FIG. 2 is a front elevational view of the motor controller of FIG. 1 showing the individual modules that may be installed in the motor controller rack.
FIG. 3 is a schematic representation of a prior art modular interconnect system using a connector system to implement separate parallel communication channels.

Referring now to FIG. 1, a motor controller 10 may be assembled within a cabinet 12 limiting access to the motor controller 10. The cabinet 12 may have a back panel 14 supporting a motor drive rack 16, a rectifier 18, and an inverter 20 which together form the principle components of the motor controller 10.

Within the cabinet 12, the drive rack 16 may receive DC power 22 and the rectifier 18 may receive a source of three-phase power 24 which is converted to DC power 26 and provided to the inverter 20. The inverter 20 may in turn provide for synthesized power waveforms 28 which are transmitted out of the cabinet 12 and connected to the windings of the motor 30.

Referring now to FIGS. 1 and 2, the motor drive rack 16 may hold a set of modules 32 including a DC-to-DC converter module 36 converting the DC power 22 to convenient voltages for powering the other modules 32. The set of modules 32 may also include one or more drive control modules 38 which, in response to programming and commands, generate gate trigger signals for triggering semiconductor devices in the rectifier 18 or inverter 20 transmitted to one or more gate driver modules 40. The gate driver modules 40 may communicate via gate signal leads 42 (typically fiber optic leads) to the power semiconductors in the rectifier 18 and inverter 20.

The modules 32 may also include a drive data recorder module 49 serving to perform data logging and to provide for common memory that may be shared by the other modules 32. In addition, the modules 32 may include a communication module 50 having a communication line 51 to communicate with an industrial control system, for example, a programmable logical control programmed to provide commands to the motor controllers 10.

The modules 32 may also include I/O modules 44, for example, digital or analog I/O modules receiving one or more feedback signals 46 from the motor 30, for example from an encoder 47, or the like. The I/O modules 44 may also receive monitoring voltages from the inverter 20 and the rectifier 18, for example, those indicating line current, line voltage, DC link current, motor voltage, and motor current, as is understood in the art.

Referring now to FIG. 3, in the prior art, the individual modules 32 were connected by parallel bus harnesses 52 in the form of ribbon cables terminated in multi-pin connectors attached to the circuit boards of the individual modules 32. The drive control modules 38 (and the communication module 50 and a drive data recorder module 49) are each connected to one parallel bus harness 52 communicating with a dual port ram 54 to provide for high-speed asynchronous communication between each other. The drive control modules 38 communicate with gate driver modules 40 and with I/O modules 44 through separate parallel bus harnesses 52.

Referring now to FIGS. 4 and 5, the present invention provides for a backplane 60 comprised of parallel conductors not forming one or more parallel channels, but rather forming multiple serial channels 62. As is understood in the art, a serial channel is one in which the bits of multi-bit logical data words are transmitted over a single or pair of conductors as sequential single bits.

In a preferred embodiment each serial channel 62 may be of one of two types: dedicated serial channels 64 communicating between only two modules 32, and shared communication channels 66 communicating among multiple modules 32 and distinguishing among communicating modules 32 using normal addressing techniques known in the art of serial communication in which addressing is contained in header fields or the like.

Referring also to FIG. 6, each of the serial channels 62 is implemented by means of parallel conductors 68 on a printed circuit board 70 or the like that span multiple electrical connectors 72 attached to the board 70 and arrayed along a line of the conductors 68. The board 70 and the connectors 72 together provide a physical backplane 74.

Each dedicated serial channel 64 may, for example, employ two conductors 76 providing a first transmission path in one direction, and two conductors 78 providing a transmission path in the opposite direction to provide full-duplex operation. In a preferred embodiment, the dedicated serial channel 64 may operate at variable speeds from 600 megabits per second to 3.125 gigabits per second. A low voltage differential signaling (LVDS) technique may be used with a programmable threshold level of 800 mV to 1600 mV. The particular protocol may be any of a number of serial protocols such as Fiber Channel, Gbit Ethernet, XAUI, Infiniband, Aurora, or other custom protocols.

The shared communication channels 66 may use any of a number of conventional shared protocols, for example SPI or I2C or proprietary protocols. Multiple shared communication channels 66 may be used (not shown), for example, one dedicated to analog I/O and the other dedicated to digital I/O.

As shown in FIG. 5 each of the dedicated serial channels 64 will have electrical connection 71 with only one connector 72 so as to provide for a communication between only two modules 32. The topology of the connection is such as to provide for a separate dedicated serial channel 64 between each pair of the drive control modules 38, communication module 50 and drive data recorder module 49 as indicated in FIG. 4 to provide a full mesh interconnect. A full mesh interconnect allows any of the module 32 listed above to connect directly to each other in the interconnect and thus prevents a failure of one module 32 or dedicated serial channel 64 from disrupting communication among all modules 32. This provides some resistance against hardware failure. A failure of one dedicated serial channel 64 does not isolate any individual module 32 which may communicate with the modules 32 joined by the failed communication module 32 using another module 32 as a bridge.

The full duplex operation allows extremely high-speed data transfer between drive control modules 38 as may be needed, for example, for synchronization of motors 30.

The shared communication channels 66 provides connections 71 to each of the connectors 69 on the rear of each the modules 32. While the dedicated serial channel 64 only connects between the drive control modules 38, communication module 50, and the drive data recorder module 49, the shared communication channels 66 connects among either the I/O or gate driver modules 32.

In practice, gating signals are communicated over separate shared communication channels 66 split between the Inverter and Rectifier Modules. I/O signals are communicated over a separate shared communication channels allowing software reconfiguration of the connections between the drive control modules 38, communication module 50 and drive data recorder module 49 and various of the I/O modules 44 by changing the address of the serial message which is receivable by all modules 32.

Figure 7:
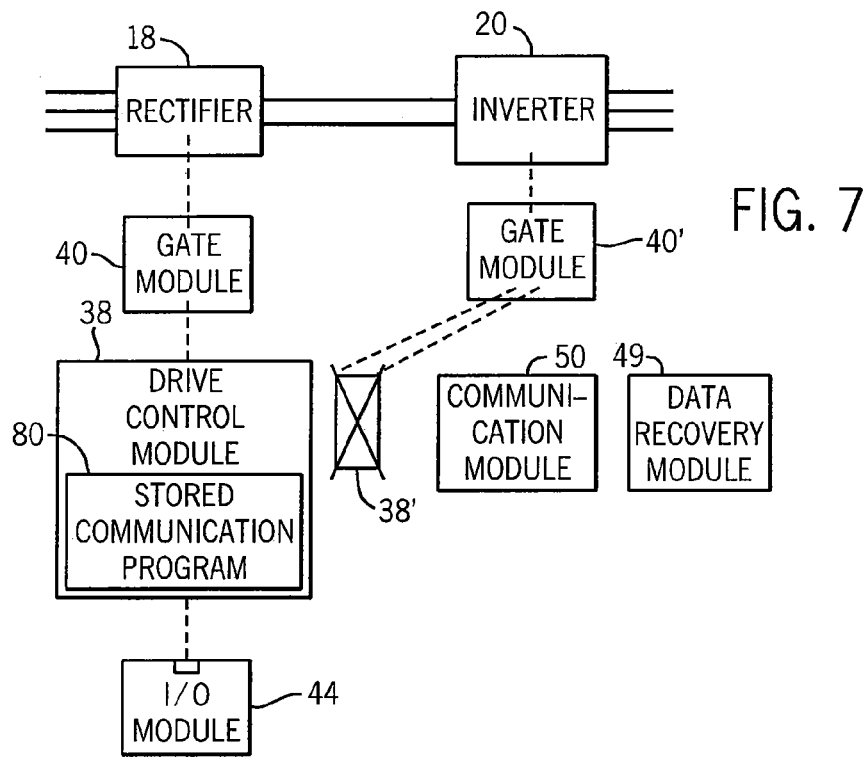
FIG. 7 is a data flow diagram showing the communication among the modules in a first configuration using the backplane of the present invention.

In this regard, and referring now to FIG. 7, in the event of a failure of drive control modules 38', drive control modules 38 may reconfigure the parameters of their stored communication program 80 to simply assume the functions of the drive control module 38' and communicate with gate driver modules 40' previously being provided with gating signals from failed drive control modules 38', and to communicate with the communication module 50 on behalf of the failed drive control module 38'.

Figure 8:
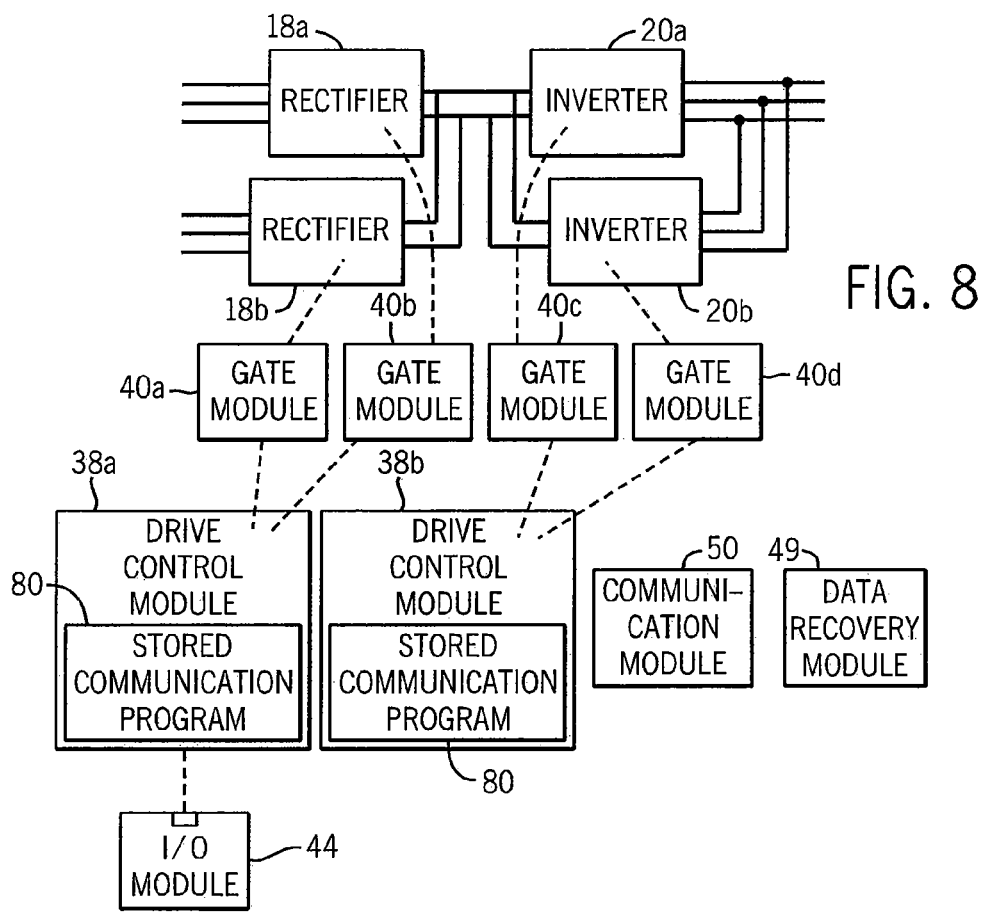
FIG. 8 is a figure similar to that of FIG. 7 showing a reconfiguration of modules using the backplane of the present invention.

Referring to FIG. 8, the flexibility engendered by the present serial backplane system further allows, for example, a given drive control module 38a to control multiple gate modules 40a and 40b in parallel which in turn control two rectifiers 18a and 18b in parallel for increased power capacity. Similarly second drive control modules 38b may communicate with gate modules 40c and 40d controlling inverters 28a and 20b in parallel. In the prior art system, described with respect to FIG. 3, a manual reconfiguration of parallel bus harnesses 52 would have to be implemented, whereas in the present invention, this reconfiguration can be done by a modification of stored programs 80 in the drive control modules 38.

The present invention has been described in terms of the preferred embodiment, and it is recognized that equivalents, alternatives, and modifications, aside from those expressly stated, are possible and within the scope of the appending claims.

I claim:

1. A motor drive system controlling power semiconductor devices to provide controlled power to an electric motor, the motor drive system comprising:
 a rack having a housing with a backplane, the housing providing slots holding modules removably held within the rack so that releasable electrical connectors on a rear face of the modules abut a mating electrical connector on the backplane;
 a set of modules including:
  at least one drive control module receiving command signals to provide gating signals for the control of the power semiconductor devices; and
  at least two gate modules receiving gating signals and providing semiconductor drive signals to the power semiconductor devices;
 wherein the backplane provides a set of separate serial communication channels communicating between the modules, each serial communication channel independently transferring multi-bit data words as sequential single bits;
 wherein the separate serial communication channels include at least one serial communication channel communicating among multiple drive control modules and gate modules to direct gating signals between specific modules according to at least one address contained in transmitted data; and
 whereby drive control modules and gate control modules may be reconfigured without rewiring.

2. The motor drive system of claim 1 wherein the power semiconductors are part of devices selected from the group consisting of: at least one rectifier and at least one inverter.

3. The motor drive system of claim 1 wherein the separate communication channels include at least one serial communication channel dedicated to one pair of modules.

4. The motor drive system of claim 1 wherein at least one serial communication channel is full-duplex.

5. The motor drive system of claim 1 wherein at least one serial communication channel provides a transfer rate in excess of two Gbit per second.

6. The motor drive system of claim 1 wherein the set of modules further includes:
- at least one communication module receiving command signals from a programmable logic controller;
- at least two drive control modules; and
- wherein the serial communication channels provide a full mesh interconnect among the communication module and the drive control modules.

7. The motor drive system of claim 1 wherein the set of modules further includes a data drive recorder recording data describing operation of the motor drive system.

8. The motor drive system of claim 1 wherein the separate serial communication channels include at least one shared serial communication channel communicating with multiple modules to direct data to specific modules according to at least one address contained in transmitted data, and at least one dedicated serial communication channel dedicated to a pair of modules;
- wherein the separate serial communication channels communicate among the control modules and the shared communication channel communicates among the control modules and the gate modules.

9. The motor drive system of claim 1 wherein modules further include input/output modules accepting feedback signals from outside the rack.

10. The motor drive system of claim 1 wherein the serial communication channels are selected from the group consisting of Fiber Channel, Gbit Ethernet, XAUI, Infiniband, and Aurora.

11. The motor drive system of claim 1 wherein the serial communication channels use low voltage differential signaling.

12. The motor drive system of claim 1 wherein the control modules include a computer executing stored software allowing the control modules to receive commands to change the gate modules to which they are connected by changing addressing on a serial communication network.

13. The motor drive system of claim 1 wherein the control modules include a computer executing stored software allowing the control modules to assume a function of a failed control module.

14. The motor drive system of claim 1 wherein the separate serial communication channels include at least two serial communication channels communicating among multiple drive control modules and gate modules to direct gating signals between specific modules according to at least one address contained in transmitted data.

15. A method of controlling power semiconductor devices to provide controlled power to an electric motor in a motor drive system including:
- a rack having a housing with a backplane, the housing providing slots holding modules removably held within the rack so that releasable electrical connectors on a rear face of the modules abut a mating electrical connector on the backplane
- a set of modules including:
  - at least one drive control module receiving command signals to provide gating signals for the control of the power semiconductor devices; and
  - at least one gate module receiving gating signals and providing semiconductor drive signals to the power semiconductor devices;
- wherein the backplane provides a set of separate serial communication channels communicating between the modules, each serial communication channel independently transferring multi-bit data words as sequential single bits;
- wherein the separate serial communication channels include at least one serial communication channel communicating among multiple drive control modules and at least one gate module to direct gating signals between specific modules according to at least one address contained in transmitted data;
- wherein the method comprises the steps of:
  (1) communicating among drive control modules and the gate control modules using different serial communication channels; and
  (2) reconfiguring the communication of gating signals among drive control modules and gate modules by changing addresses contained in the transmitted data.

16. The method of claim 15 wherein the control modules receive commands to change the gate modules to which they are connected by changing addressing of messages on a serial communication channel.

17. The method of claim 15 wherein the control modules assume the function of a failed control module by communicating over the dedicated serial communication channels and the backup gate driver module shared communication channel.

18. The method of claim 15 wherein the separate serial communication channels include at least two serial communication channels communicating among multiple drive control modules and gate modules to direct gating signals between specific modules according to at least one address contained in transmitted data.

* * * * *